United States Patent
Kobayashi

(10) Patent No.: US 12,283,299 B2
(45) Date of Patent: Apr. 22, 2025

(54) MAGNETIC STORAGE DEVICE AND CONTROL METHOD OF MAGNETIC STORAGE DEVICE

(71) Applicant: Kioxia Corporation, Tokyo (JP)

(72) Inventor: Yosuke Kobayashi, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/170,257

(22) Filed: Feb. 16, 2023

(65) Prior Publication Data

US 2023/0197134 A1 Jun. 22, 2023

Related U.S. Application Data

(63) Continuation of application No. 17/003,931, filed on Aug. 26, 2020, now Pat. No. 11,610,618.

(30) Foreign Application Priority Data

Jun. 24, 2020 (JP) ................................. 2020-108821

(51) Int. Cl.
*G11C 11/16* (2006.01)

(52) U.S. Cl.
CPC ...... *G11C 11/1677* (2013.01); *G11C 11/1695* (2013.01)

(58) Field of Classification Search
CPC ............ G11C 11/1677; G11C 11/1695; G11C 11/1675

See application file for complete search history.

(56) References Cited

U.S. PATENT DOCUMENTS

| | | | |
|---|---|---|---|
| 7,355,882 B2 | 4/2008 | Boeve | |
| 10,562,658 B2 | 2/2020 | Fujimori | |
| 2004/0017639 A1* | 1/2004 | Deak | H10N 50/10 |
| | | | 257/295 |
| 2004/0090835 A1 | 5/2004 | Miyatake | |
| 2006/0067115 A1 | 3/2006 | Gruber | |
| 2007/0070686 A1* | 3/2007 | Boeve | G11C 11/16 |
| | | | 365/158 |
| 2008/0080232 A1* | 4/2008 | Sturm | G11C 11/16 |
| | | | 365/158 |
| 2013/0069809 A1* | 3/2013 | Venkatraman | H03M 1/04 |
| | | | 341/155 |
| 2016/0163254 A1* | 6/2016 | Lee | G11C 11/1695 |
| | | | 345/545 |
| 2017/0315879 A1 | 11/2017 | Park | |

(Continued)

FOREIGN PATENT DOCUMENTS

| | | |
|---|---|---|
| CN | 107430558 A | 12/2017 |
| JP | 2004303382 A | 10/2004 |

*Primary Examiner* — Uyen Smet
(74) *Attorney, Agent, or Firm* — Kim & Stewart LLP

(57) ABSTRACT

According to one embodiment, a magnetic storage device includes a nonvolatile magnetic memory including a magnetoresistance effect element capable of storing data. A magnetic sensor is configured to measure the magnitude of an external magnetic field. A controller is configured to detect errors in the data at first time intervals when the measured magnitude of the external magnetic field is less than a threshold value and to detect errors in the data at second time intervals shorter than the first time interval when the measured magnitude of the external magnetic field is equal to or greater than the threshold value.

23 Claims, 11 Drawing Sheets

(56) References Cited

U.S. PATENT DOCUMENTS

| | | |
|---|---|---|
| 2017/0364407 A1 | 12/2017 | Osada |
| 2018/0158525 A1* | 6/2018 | Nozaki ............... G11C 11/1677 |
| 2018/0267853 A1 | 9/2018 | Saida |
| 2019/0140020 A1* | 5/2019 | Ying ................... H01F 10/3286 |
| 2019/0259438 A1* | 8/2019 | Kishi .................. G11C 11/1673 |
| 2020/0106002 A1 | 4/2020 | Song |

* cited by examiner

MAGNETIC STORAGE DEVICE AND CONTROL METHOD OF MAGNETIC STORAGE DEVICE

CROSS-REFERENCE TO RELATED APPLICATION(S)

This application is a continuation of U.S. patent application Ser. No. 17/003,931, filed on Aug. 26, 2020, which is based upon and claims the benefit of priority from Japanese Patent Application No. 2020-108821, filed on Jun. 24, 2020, the entire contents of each of which are incorporated herein by reference.

FIELD

Embodiments described herein relate generally to a magnetic storage device and a control method for a magnetic storage device.

BACKGROUND

A magnetic storage device, such as magnetoresistance random access memory (MRAM) using a magnetoresistance effect element as a storage element is known.

DETAILED DESCRIPTION

Figure 1:
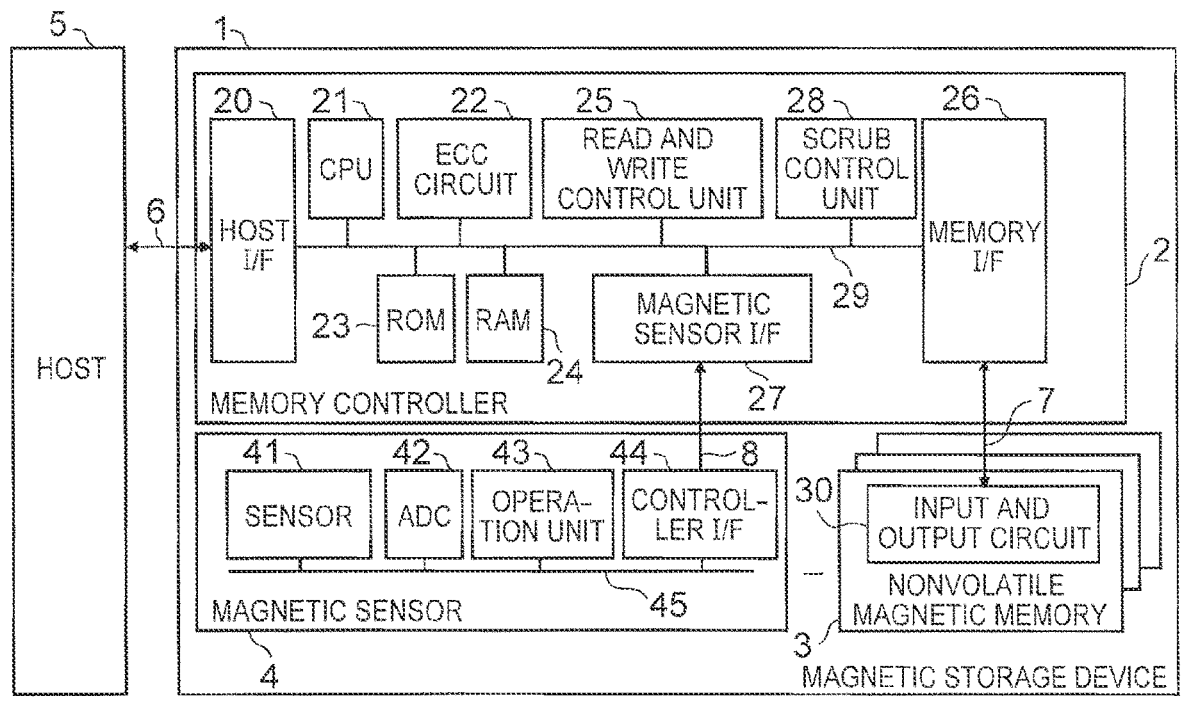
FIG. 1 is a block diagram of a magnetic storage device according to a first embodiment.

Embodiments provide a highly reliable magnetic storage device and a control method of a magnetic storage device.

In general, according to one embodiment, a magnetic storage device includes a nonvolatile magnetic memory including a magnetoresistance effect element capable of storing data. A magnetic sensor configured to measure a magnitude of an external (ambient) magnetic field is provided. A controller is configured to detect errors in the data stored in the nonvolatile magnetic memory at first time intervals when the external magnetic field is below a threshold value. The controller is configured to detect errors in the data stored in the nonvolatile magnetic memory at second time intervals shorter than the first time intervals when the magnitude of the external magnetic field measured by the magnetic sensor is equal to or greater than the threshold value.

Hereinafter, magnetic storage devices of the present disclosure will be described with reference to the drawings. In general, the drawings are schematic, and, for example, any depicted relationship between the thicknesses or the planar dimensions, the thickness ratios of each layer, and the like may be different from the actual ones. In addition, in the embodiments, substantially the same elements are denoted by the same reference numerals and additional description thereof may be omitted.

(1) First Embodiment

A magnetic storage device 1 of the first embodiment will be described with reference to FIGS. 1 to 7.

(1)-(a) Configuration Example of Magnetic Storage Device

FIG. 1 is a block diagram of the magnetic storage device 1. The magnetic storage device 1 includes a memory controller 2, a nonvolatile magnetic memory 3, and a magnetic sensor 4.

The memory controller 2 has a configuration in which a host interface (I/F) 20, a central processing unit (CPU) 21, an error checking and correcting (ECC) circuit 22, a read only memory (ROM) 23, a random access memory (RAM 24, a read and write control unit 25, a memory interface (I/F) 26, a magnetic sensor interface (I/F) 27, and a scrub control unit 28 are interconnected via an internal bus 29.

The host I/F 20 performs an interface process between the memory controller 2 and the host 5. The host I/F 20 is communicatively connected to the host 5 via a connection line 6. The connection line 6 includes, for example, a power supply line, a data bus, a command line, and the like.

The CPU 21 controls the operation of the entire magnetic storage device 1. As a program for controlling the CPU 21, firmware or the like stored in the ROM 23 is used, or alternatively a program stored in the ROM 23 is loaded on the RAM 24 to execute a predetermined process. The CPU 21 creates various tables in the RAM 24, receives a write command, a read command, and an erase command from the host 5, and performs data writing processing, data reading processing, and data erasing processing on the nonvolatile magnetic memory 3. Data transfers, such as data writing to the nonvolatile magnetic memory 3 and data reading from the nonvolatile magnetic memory 3, to/from the external host 5 are performed via the host I/F 20 and the memory I/F 26.

The ECC circuit 22 is, for example, an encoding and decoding circuit having an error correction function. The ECC circuit 22 encodes data to be written in the nonvolatile magnetic memory 3 with an error correction code such as a BCH (Bose Chaudhuri Hocquenghem) code. The ECC circuit 22 also corrects errors in the data read from the nonvolatile magnetic memory 3.

The ROM 23 stores firmware, such as control programs, used by the CPU 21. The RAM 24 is used as a work area for the CPU 21 and stores control programs and various tables.

The read and write control unit 25 controls data reading from a memory cell array 36 and data writing to the memory cell array 36. The read and write control unit 25 controls a word line driver 33 and a bit line driver 35 based on the command and the address. As a result, one or more data items designated by the address are read from a memory cell MC or written to a memory cell MC. In the following description, a command may also be called an instruction or a request.

The memory I/F 26 is communicatively connected to the nonvolatile magnetic memory 3 via a connection line 7. The connection line 7 includes, for example, a power supply line, a data bus, a command line, and the like. The memory I/F 26 controls signal transmission between the memory controller 2 and the nonvolatile magnetic memory 3. The memory I/F 26 supplies commands and addresses from the host 5 and write data based on the commands and addresses from the host 5 to an input and output circuit 30. The read data is received from the input and output circuit 30.

The magnetic sensor I/F 27 performs the interface process between the memory controller 2 and the magnetic sensor 4. The magnetic sensor I/F 27 is communicatively connected to the magnetic sensor 4 via a connection line 8. The connection line 8 includes, for example, a power supply line, a data bus, a command line, and the like.

The scrub control unit 28 controls a scrubbing process. The scrubbing process is a process of periodically performing error detection and correction on a data storing area to prevent the errors from reaching an uncorrectable level (ECC allowable limit). The scrubbing process includes inspection and rewriting of data stored in the memory cells MC. The rewriting of data is performed only as necessary. In the following description, the scrubbing process may be called scrubbing.

When receiving a scrub command from the CPU 21, the scrub control unit 28 performs the scrubbing process on the data stored in the plurality of memory cells MC. The address range of the memory cells MC that are the target of one scrub operation is called a scrub execution unit and is predetermined size. The scrub execution unit may be determined based on, for example, the memory cells MC that are collectively read as a unit. Alternatively, the scrub execution unit may be determined based on the position of the memory cells MC in the memory cell array 36.

Figure 2:
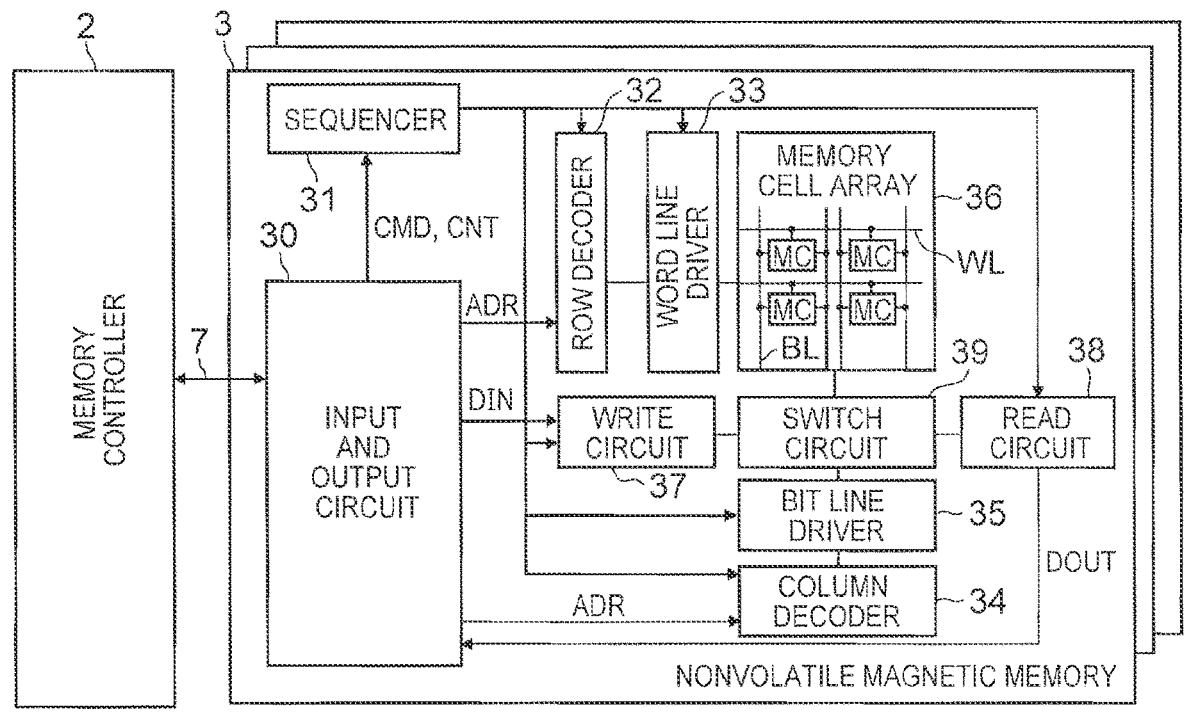
FIG. 2 is a block diagram of a nonvolatile magnetic memory according to a first embodiment.

Next, the configuration of the nonvolatile magnetic memory 3 will be described with reference to FIG. 2. FIG. 2 is a block diagram of the nonvolatile magnetic memory 3. The nonvolatile magnetic memory 3 includes the input and output circuit 30, a sequencer 31, a row decoder 32, the word line driver 33, a column decoder 34, the bit line driver 35, the memory cell array 36, a write circuit 37, a read circuit 38, and a switch circuit 39.

The nonvolatile magnetic memory 3 is, for example, a spin-transfer torque (STT) type magnetoresistance random access memory (MRAM). In a MRAM, a magnetic tunnel junction (MTJ) element can be used as a magnetoresistance effect element for a storage element.

An MTJ element includes two magnetic layers and a nonmagnetic layer therebetween. The direction of the magnetization or magnetic anisotropy of a first magnetic layer generally remains unchanged. The direction of magnetization or magnetic anisotropy of a second magnetic layer is changeable. When a write current flows from the first magnetic layer to the second magnetic layer, the magnetization directions of the two magnetic layers become parallel. When the magnetization directions of the two magnetic layers are parallel, the MTJ element has the minimum resistance value. When the write current flows from the second magnetic layer to the first magnetic layer, the magnetization directions of the two magnetic layers become antiparallel. When the magnetization directions of the two magnetic layers are antiparallel, the MTJ element has the maximum resistance value. The states indicating these two different resistance values are assigned to binary data values.

The nonvolatile magnetic memory 3 receives a command CMD, an address ADR, input data DIN (write data), and various control signals CNT from the memory controller 2. The nonvolatile magnetic memory 3 transmits output data DOUT (read data) to the memory controller 2. The nonvolatile magnetic memory 3 performs writing, reading, scrubbing process, or the like based on the command CMD, the address ADR, and various control signals CNT from the memory controller 2. The nonvolatile magnetic memory 3 may include, for example, a plurality of memory chips capable of operating independently of each other.

The memory cell array 36 includes a plurality of memory cells MC. Each memory cell MC is connected to a plurality of bit lines BL and a plurality of word lines WL. Each memory cell MC includes a MTJ element and a cell transistor. The MTJ element can store data according to the magnetoresistance effect. The cell transistor is connected in series with the MTJ element and controls the supply of the electric power to the MTJ element.

The input and output circuit 30 is connected to the memory I/F 26 of the memory controller 2 via the connection line 7. The input and output circuit 30 receives the data DIN from the memory controller 2 and supplies the received data DIN to the write circuit 37. Further, the input and output circuit 30 receives the data DOUT from the memory cells MC of the memory cell array 36 from the read circuit 38 and supplies this data as the data DOUT to the memory controller 2. Further, the input and output circuit 30 receives the commands CMD and various control signals CNT from the memory controller 2 and supplies the received commands CMD and control signals CNT to the sequencer 31. The input and output circuit 30 also receives the address ADR from the memory controller 2 and supplies the received address ADR to the row decoder 32 and the column decoder 34.

The various signals CMD, CNT, ADR, DIN, and DOUT may be supplied to a predetermined circuit in the nonvolatile magnetic memory 3 via an interface (I/F) circuit provided separately from the chip (package) of the nonvolatile magnetic memory 3.

The sequencer 31 receives the command CMD and various control signals CNT. The sequencer 31 controls the operation of each of various circuits in the nonvolatile magnetic memory 3 based on the command CMD and the control signal(s) CNT. The sequencer 31 can transmit a control signal CNT to the memory controller 2 in accordance with the operating status in the nonvolatile magnetic memory 3. For example, the sequencer 31 stores various kinds of information regarding performance of the write operation and the read operation as setting information.

The row decoder 32 decodes the row address in the address ADR. The word line driver 33 selects a row (for example, a word line WL) of the memory cell array 36 based on the row address. The word line driver 33 can supply a predetermined voltage to the word line WL.

The column decoder 34 decodes the column address in the address ADR. The bit line driver 35 selects a column (for example, a bit line BL) of the memory cell array 36 based on the column address. The bit line driver 35 is connected to the memory cell array 36 via the switch circuit 39. The bit line driver 35 can supply a predetermined voltage to the bit line BL.

The write circuit 37 supplies various voltages and/or currents for writing data to a selected/addressed memory cell MC (selected cell) based on the address ADR during the write operation. For example, the data DIN is supplied to the write circuit 37 as data to be written in the memory cell array 36. As a result, the write circuit 37 writes the data DIN in the memory cell MC. The write circuit 37 includes, for example, a write driver or sink.

The read circuit 38 supplies various voltages and/or currents for reading data from the memory cell(s) MC selected based on the address ADR during the read operation. As a result, the data stored in the memory cells MC can be read.

The read circuit 38 outputs the data read from the memory cell array 36 to the outside of the nonvolatile magnetic memory 3 as output data DOUT. The read circuit 38 includes, for example, a read driver and a sense amplifier circuit.

The switch circuit 39 connects one of the write circuit 37 or the read circuit 38 to the memory cell array 36 and the bit line driver 35. As a result, the nonvolatile magnetic memory 3 executes an operation corresponding to the command CMD.

Next, returning to FIG. 1, the configuration of the magnetic sensor 4 will be described. The magnetic sensor 4 detects an external magnetic field Hex and transmits the measured magnitude of the external magnetic field Hex to the memory controller 2. The external magnetic field Hex here is a magnetic field from the external environment around the nonvolatile magnetic memory 3. The magnetic sensor 4 has a configuration in which a sensor 41, an analog-digital converter (ADC) 42, an operation unit 43, and a controller interface (I/F) 44 are interconnected via an internal bus 45. The magnetic sensor 4 is communicatively connected to the memory controller 2 via the connection line 8. The connection line 8 includes, for example, a power supply line, a data bus, a command line, and the like.

The sensor 41 is, for example, a Hall IC (Integrated Circuit) or an MTJ element. A Hall IC outputs a voltage signal according to the magnitude of the magnetic flux density to the ADC 42. The MTJ element varies in the resistance value thereof (or, alternatively, voltage value under a constant current is also acceptable) according to changes in external magnetic field Hex. Changes in resistance value of the MTJ element are supplied as an analog signal to the ADC 42 during the operation of the magnetic storage device 1.

The ADC 42 converts the analog signal output by the sensor 41 into a digital signal and supplies the digital signal to the operation unit 43.

The operation unit 43 obtains the magnitude of the external magnetic field Hex by performing a predetermined calculation using the digital signal output by the ADC 42.

The controller I/F 44 performs the interface process between the memory controller 2 and the magnetic sensor 4. The controller I/F 44 transmits the magnitude of the external magnetic field Hex obtained by the operation unit 43 to the memory controller 2.

The host 5 commands the memory controller 2 to perform operations such as writing and reading in the nonvolatile magnetic memory 3. The host 5 is communicatively connected to the memory controller 2 by the connection line 6. The connection line 6 includes, for example, a power supply line, a data bus, a command line, and the like.

Figure 3:
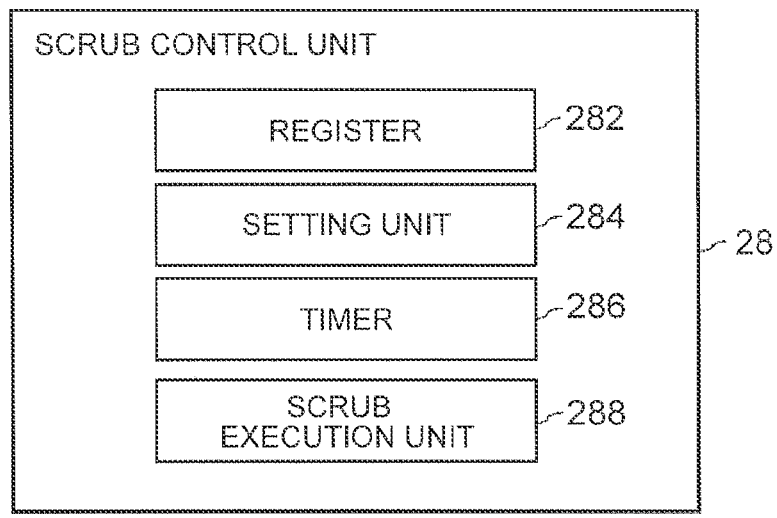
FIG. 3 is a block diagram of a scrub control unit of a magnetic storage device according to a first embodiment.

FIG. 3 is a block diagram of the scrub control unit 28. The scrub control unit 28 includes a register 282, a setting unit 284, a timer 286, and a scrub execution unit 288.

The register 282 stores information about a relationship between a time ta (referred to as allowable time ta) from performing a scrubbing process until the ECC allowable limit is reached as function of the magnitude of the external magnetic field Hex. The ECC allowable limit reflects an error state beyond which correction of data (defective bits) by the ECC circuit 22 becomes impossible. Information indicating the relationship between the allowable time ta and the magnitude of the external magnetic field Hex may be stored in the ROM 23 instead of the register 282.

Figure 4:
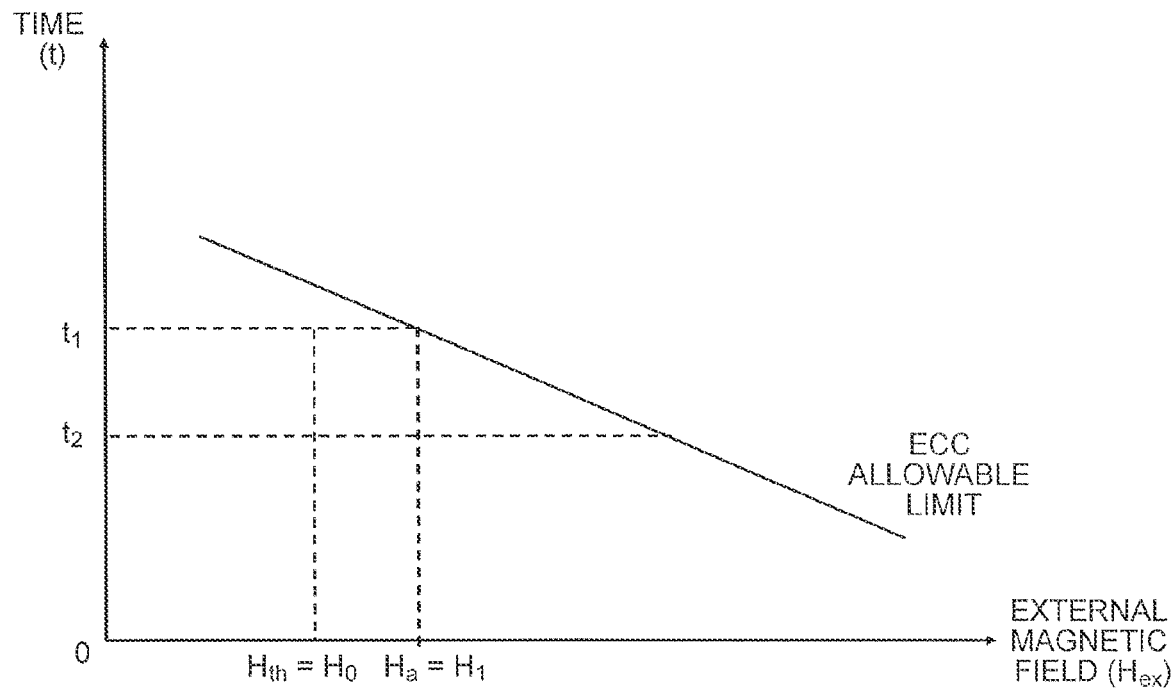
FIG. 4 is a graph depicting a relationship between an allowable time and a magnitude of an external magnetic field for a magnetic storage device according to a first embodiment.

The information stored in the register 282 corresponds to, for example, the graph shown in FIG. 4 and is management data acquired in advance. FIG. 4 is an example of a graph showing the relationship between the allowable time ta and the magnitude of the external magnetic field Hex. The vertical axis (Y axis) represents time t, and the horizontal axis (X axis) represents the magnitude of the external magnetic field Hex. As shown in FIG. 4, the allowable time ta decreases as the external magnetic field Hex increases.

An allowable magnetic field Ha corresponding to a current scrubbing time tsc can be understood from the management data corresponding to the graph shown in FIG. 4, or the like. The scrubbing time tsc is the time from one scrubbing process to the next scrubbing process. The allowable magnetic field Ha is the magnitude of the external magnetic field Hex at which the number of defective bits of the magnetic storage device 1 reaches the ECC allowable limit when a predetermined time elapsed.

The setting unit 284 sets, as a threshold magnetic field Hth, a value less than the magnitude of the allowable magnetic field Ha corresponding to the current scrubbing time tsc based on the management data stored in the register 282. The setting unit 284 receives the magnitude of the external magnetic field Hex from the magnetic sensor 4. Next, the setting unit 284 compares the received magnitude of the external magnetic field Hex with the magnitude of the threshold magnetic field Hth, and when the magnitude of the external magnetic field Hex is equal to or greater than the magnitude of the threshold magnetic field Hth (Hex≥Hth), the scrubbing time tsc is set to a time shorter than the currently set time interval. When the magnitude of the external magnetic field Hex is less than the magnitude of the threshold magnetic field Hth (Hex<Hth), the scrubbing time tsc remains at the currently set time interval.

An example of the operation of the setting unit 284 will be described with reference to FIG. 4. Since the magnitude of the allowable magnetic field Ha when the scrubbing time tsc is t1 is H1, the setting unit 284 sets the threshold magnetic field Hth to H0, which is smaller than H1. When the magnitude of the external magnetic field Hex received from the magnetic sensor 4 is H0, the magnitude is equal to or greater than the threshold magnetic field, and thus the setting unit 284 sets the scrubbing time tsc to t2 which is shorter than the currently set t1.

The timer 286 measures the time (referred to as system time T) elapsed since the completion of the most recent scrubbing process. When the scrub execution unit 288 executes the scrubbing process on the nonvolatile magnetic memory 3, the timer 286 re-initializes the measured value and starts a new measurement. If the system time T is longer than the scrubbing time tsc (T>tsc), the scrub execution unit 288 executes the scrubbing process on the nonvolatile magnetic memory 3.

The above-mentioned functions of the memory controller 2 are implemented by hardware such as a processor such as a CPU in conjunction with ROM and RAM. For example, a program stored in the ROM is read out into the RAM, and the CPU executes the program in the RAM, thereby executing an operation of the memory controller 2.

(1)-(b) Control Method of Scrubbing Process

Figure 5:
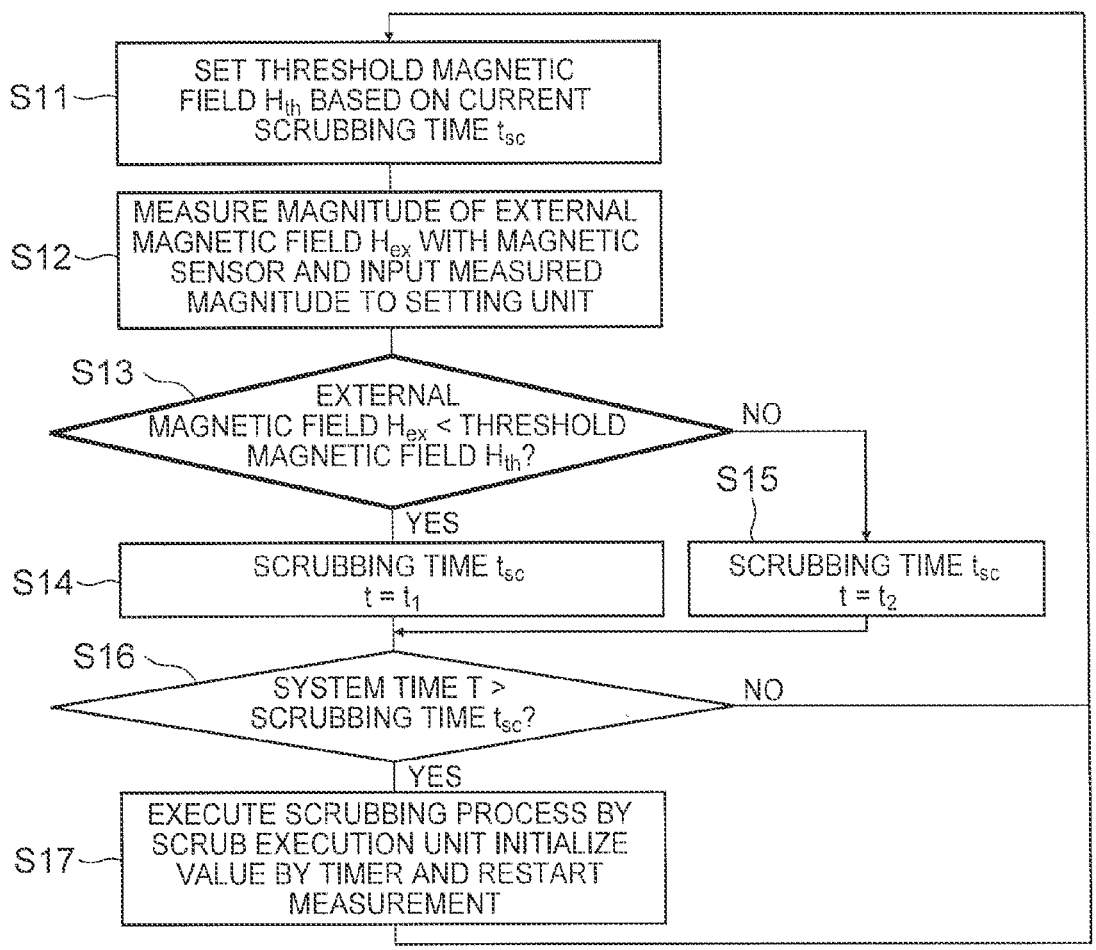
FIG. 5 is a diagram illustrating a control method of a scrubbing process of a magnetic storage device according to a first embodiment.

Next, a control method of the scrubbing process of the magnetic storage device 1 will be described with reference to FIG. 5.

The setting unit 284 sets, as the threshold magnetic field Hth, a value less than the magnitude of the allowable magnetic field Ha corresponding to the current scrubbing time tsc based on the management data stored in the register 282 (step S11).

The magnetic sensor 4 measures the magnitude of the external magnetic field Hex and inputs the measured magnitude to the setting unit 284 of the memory controller 2 (step S12).

The setting unit 284 receives the magnitude of the external magnetic field Hex from the magnetic sensor 4 and compares the magnitude of the external magnetic field Hex with the magnitude of the threshold magnetic field Hth (step S13).

When the magnitude of the external magnetic field Hex is less than the magnitude of the threshold magnetic field Hth (Hex<Hth) (Yes in step S13), the scrubbing time tsc remains at the currently set time interval t1 (step S14) and the process proceeds to step S16.

When the magnitude of the external magnetic field Hex is equal to or greater than the magnitude of the threshold magnetic field Hth (Hex≥Hth) (No in step S13), the setting unit 284 sets the scrubbing time tsc to a time interval (for example, t=t2) shorter than the currently set time interval t1 (step S15) and the process proceeds to step S16.

When the system time T is longer than the scrubbing time tsc (T>tsc) (Yes in step S16), the scrub execution unit 288 of the memory controller 2 executes the scrubbing process on the nonvolatile magnetic memory 3 and the timer 286 initializes the measured values up and starts a new measurement (step S17).

When the system time T is equal to or less than the scrubbing time tsc (T≤tsc) (No in step S16), the process returns to step S11 and the same process as described above is repeated.

The write error and retention characteristics of the MRAM are deteriorated by external magnetic fields. From the viewpoint of reliability, there is an upper limit to the permissible external magnetic field for an MRAM, and in general, the allowable external magnetic field range is described in the product specifications of the MRAM. However, this makes it difficult to use MRAM products in an environment in which a strong magnetic field is generated and the application range of MRAM products is narrowed. For example, an environment in which a magnetic field is generated is a transformer, a power supply of a high power specification server, a motor of an electric vehicle, or the vicinity of a speaker of a personal computer or a mobile device. In order to solve the above-mentioned problem, a magnetic shield is generally used for MRAM, but the magnetic shield has a problem of increasing the mounting thickness of MRAM components.

Figure 6:
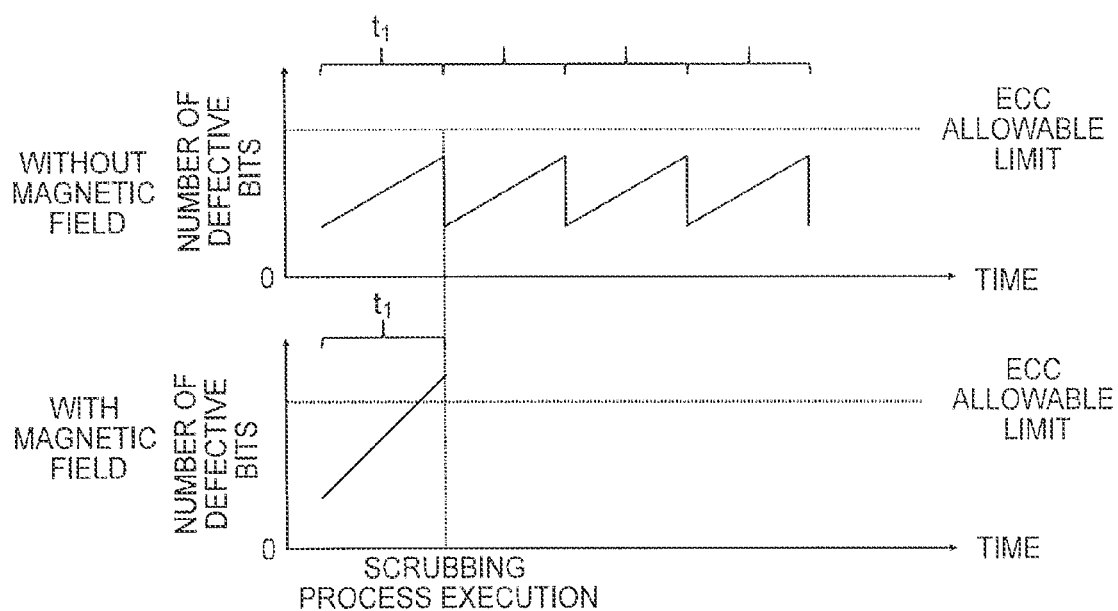
FIG. 6 is a diagram illustrating a scrubbing process of a magnetic storage device according to a comparative example.

FIG. 6 is a diagram illustrating a scrubbing process of a magnetic storage device according to a comparative example. In the graph of FIG. 6, the horizontal axis represents time and the vertical axis represents the number of defective bits. The upper part is a graph depicts a normal state without an external magnetic field, and the lower part is a graph depicts a state in which an external magnetic field is applied to the magnetic storage device. The magnetic storage device according to the comparative example does not include a magnetic sensor. Therefore, the scrubbing process is always performed on the nonvolatile magnetic memory at a fixed time interval. As a result, when a magnetic field is applied to the magnetic storage device and the retention characteristic is deteriorated as shown in the lower part, the number of defective bits exceeds the ECC allowable limit. As a result, the data initially written by the ECC cannot be restored normally.

Figure 7:
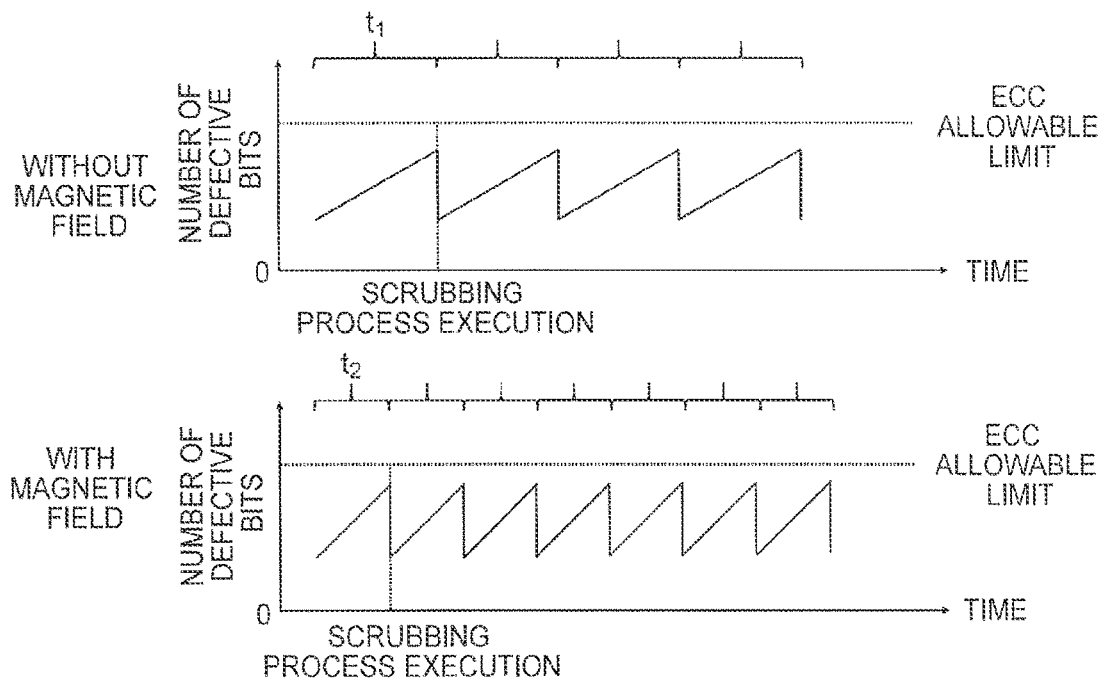
FIG. 7 is a diagram illustrating a scrubbing process of a magnetic storage device according to a first embodiment.

FIG. 7 is a diagram illustrating the scrubbing process of the magnetic storage device 1 according to the first embodiment. The magnetic storage device 1 according to the present embodiment includes the magnetic sensor 4 in addition to the memory controller 2 and the nonvolatile magnetic memory 3. When the external magnetic field Hex is applied, the magnetic sensor 4 converts the external magnetic field Hex into a voltage signal and inputs the converted voltage signal to the memory controller 2. The memory controller 2 performs the scrubbing process on the nonvolatile magnetic memory 3 at time intervals that are set according to the measured magnitude of the magnetic field. Therefore, as shown in the lower part, the interval for performing the scrubbing process changes to t2, which is shorter than t1, according to the magnitude of the magnetic field, and the scrubbing process can be performed before the ECC allowable limit is reached. Therefore, the data initially written by the ECC can be restored normally even under the influence of the external magnetic field Hex.

In this way, by connecting the memory controller 2 and the magnetic sensor 4 to each other, the scrubbing time tsc of the magnetic storage device 1 can be controlled according to the measured/sensed magnitude of the external magnetic field Hex. As a result, retention characteristic can be maintained and write errors can be prevented, thus the reliability and the external magnetic field tolerance of the magnetic storage device 1 can be improved. That is, since the magnetic storage device 1 can operate in a high magnetic field environment, the magnetic storage device 1 can be applied to a product such as a transformer, a power supply of a high power specification server, a motor of an electric vehicle, and/or be located in the vicinity of a speaker of a personal computer or a mobile device. Furthermore, the magnetic storage device 1 does not necessarily require a magnetic shield, which contributes to downsizing of the product.

(2) Second Embodiment

A magnetic storage device 1a of the second embodiment will be described with reference to FIGS. 8 to 13.

(2)-(a) Configuration Example of Magnetic Storage Device

Figure 8:
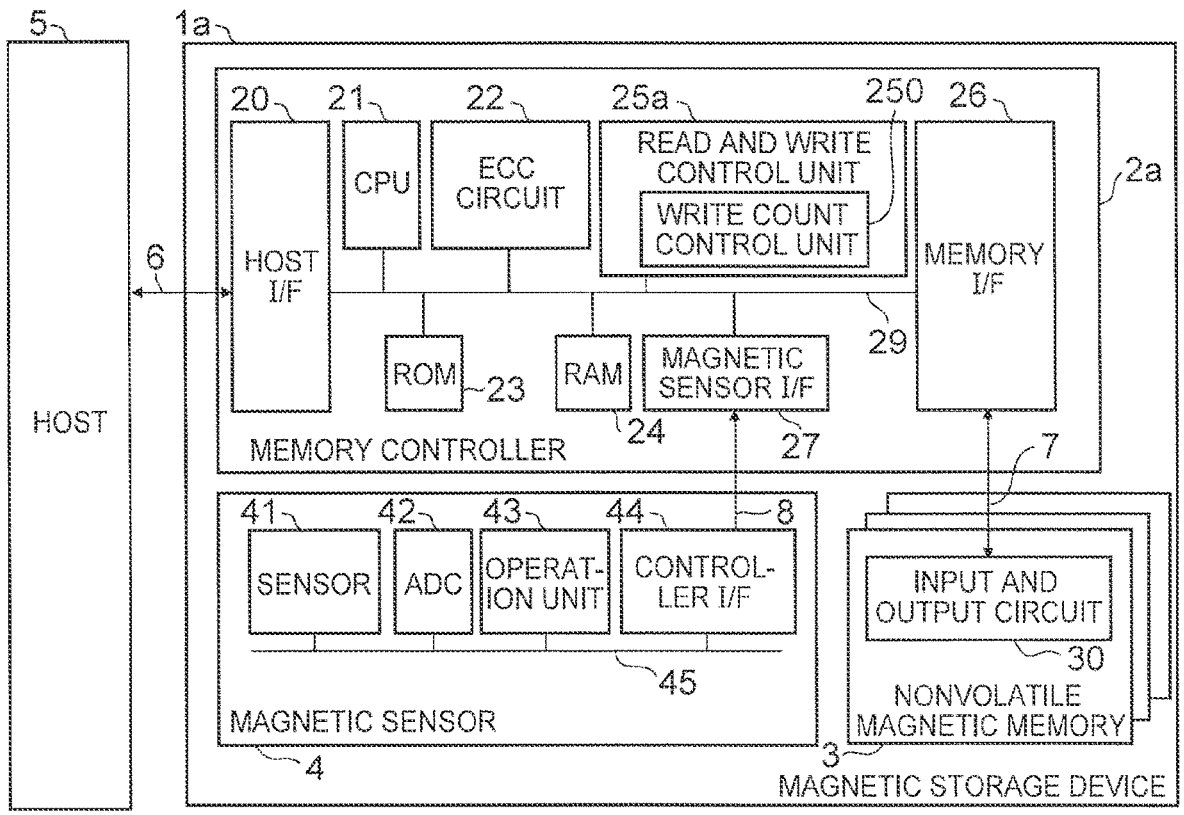
FIG. 8 is a block diagram of a magnetic storage device according to a second embodiment.

FIG. 8 is a block diagram of a magnetic storage device 1a. The magnetic storage device 1a according to the second embodiment has a similar configuration as the magnetic storage device 1 according to the first embodiment, but is different in that a read and write control unit 25a includes a write count control unit 250. The scrub control unit 28 of the first embodiment is not an essential element of the magnetic storage device 1a according to the second embodiment and thus is not shown in FIG. 8. However, it is also possible to combine the first embodiment and the second embodiment. Therefore, the magnetic storage device 1a may additionally include a scrub control unit 28.

Figure 9:
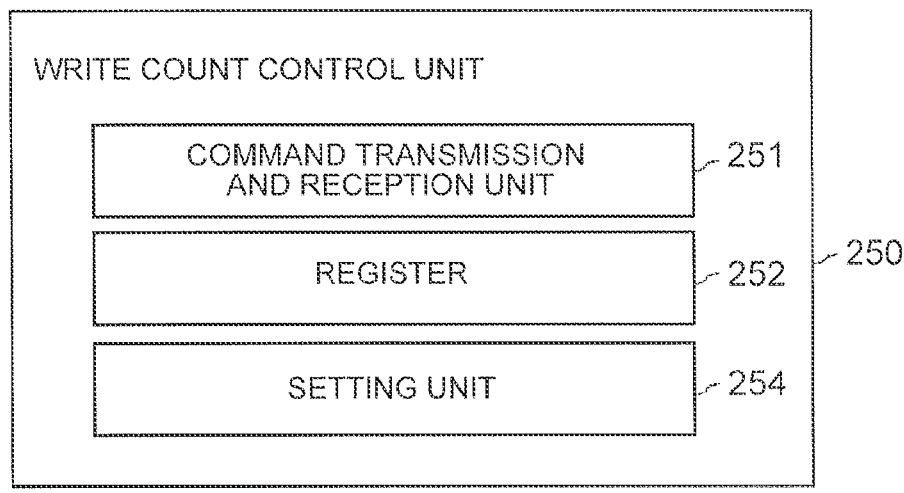
FIG. 9 is a block diagram of a write count control unit of a magnetic storage device according to a second embodiment.

FIG. 9 is a block diagram of the write count control unit 250. The write count control unit 250 includes a command transmission and reception unit 251, a register 252, and a setting unit 254.

When the command transmission and reception unit 251 receives a write command from the host 5, a command requesting to write to one memory cell MC multiple times (n times) is transmitted to the nonvolatile magnetic memory 3. The value n for the number of writes is set by the setting unit 254 according to the magnitude of the external magnetic field Hex.

The register 252 stores information indicating a relationship between a write error rate (WER) and the magnitude of the external magnetic field Hex for writing n times. The information stored in the register 252 corresponds to, for example, the graph shown in FIG. 10 described later and is management data acquired in advance. Information indicating the relationship between the WER and the magnitude of the external magnetic field Hex in the case of writing n times may be stored in the ROM 23 instead of the register 252.

Figure 10:
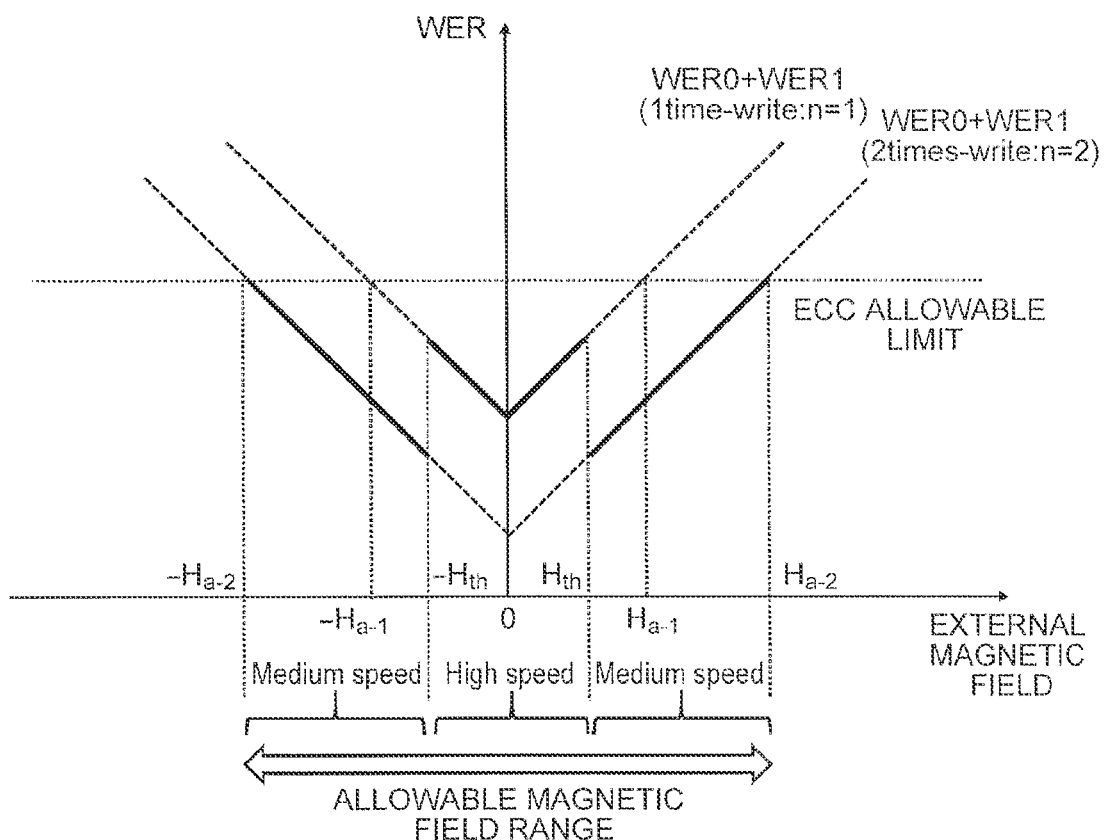
FIG. 10 depicts a relationship between a write error rate (WER) and a magnitude of an external magnetic field for a magnetic storage device according to a second embodiment.

FIG. 10 is an example of a graph showing a relationship between the WER and the magnitude of the external magnetic field Hex for the case of single writing (n=1) and the case of writing twice (n=2).

The vertical axis (Y axis) represents a total of the write error rate (WER0) when writing 0 and the write error rate (WER1) when writing 1. The horizontal axis (X axis) represents the magnitude of the external magnetic field Hex.

When the magnitude of the external magnetic field Hex is 0, the WER is at the minimum, but when an external magnetic field Hex is applied to the magnetic storage device 1a at higher magnitudes, the WER rises with increasing magnitude of the external magnetic field Hex. Therefore, it is necessary to limit the magnitude of the external magnetic field Hex that is applied to the magnetic storage device 1a. The magnitude limit varies according to the ECC allowable limit. In the graph, the coordinate on the vertical axis corresponds to the ECC allowable limit, and the coordinate on the horizontal axis corresponds to an allowable magnetic field Ha-n. The allowable magnetic field Ha-n is the maximum value of the magnitude of the external magnetic field Hex at which the nonvolatile magnetic memory 3 is considered to operate successfully. The threshold magnetic field Hth generally needs to be set to a value less than the allowable magnetic field Ha-n. The threshold magnetic field Hth is preferably close to the value of the allowable magnetic field Ha-n.

The setting unit 254 sets, as the threshold magnetic field Hth, a value less than the magnitude of the allowable magnetic field Ha-n corresponding to the current value n for the number of writes based on the management data stored in the register 252.

The setting unit 254 receives the magnitude of the external magnetic field Hex from the magnetic sensor 4. The setting unit 254 compares the magnitude of the received external magnetic field Hex with the magnitude of the threshold magnetic field Hth, and when the magnitude of the external magnetic field Hex is equal to or greater than the magnitude of the threshold magnetic field Hth (Hex≥Hth), the n value (number of writes) can be set to a greater value than the currently set n value (for example, n can be set to a value of 2 instead a value of 1). When the magnitude of the external magnetic field Hex is less than the magnitude of the threshold magnetic field Hth (Hex<Hth), the number of writes (n value) remains at the currently set number of times (for example, n=1).

(2)-(b) Control Method of Writing Data

Next, a control method of writing data in the magnetic storage device 1a will be described with reference to FIG. 11.

The setting unit 254 sets, as the threshold magnetic field Hth, a value less than the magnitude of the allowable magnetic field Ha-n corresponding to the currently set number of writes (value of n) based on the management data stored in the register 252 (step S21).

The magnetic sensor 4 measures the magnitude of the external magnetic field Hex and inputs this magnitude to the setting unit 254. (Step S22).

The setting unit 254 receives the magnitude of the external magnetic field Hex from the magnetic sensor 4 and compares the magnitude of the external magnetic field Hex to the magnitude of the threshold magnetic field Hth (step S23).

When the magnitude of the external magnetic field Hex is less than the magnitude of the threshold magnetic field Hth (Hex<Hth) (Yes in step S23), the number of writes (n value) remains at the currently set number (for example, n=1) (step S24) and the process proceeds to step S26.

When the magnitude of the external magnetic field Hex is equal to or greater than the magnitude of the threshold magnetic field Hth (Hex≥Hth) (No in step S23), the setting unit 254 sets the number of writes (n value) to another value (for example, n=2) that is greater than the currently set number (for example, n=1) (step S25) and the process proceeds to step S26.

When there is a write command from the host 5 (Yes in step S26), the command transmission and reception unit 251 transmits a command requesting to write to the nonvolatile magnetic memory 3 n times (step S27). That is, writing according to a command from the host 5 is repeated n times. When n is greater than 1, the same information is written to the nonvolatile memory 3 multiple times to help avoid and/or compensate for possible write errors.

If a write command is not received from the host 5 (No in step S26), the process returns to step S21, and the same process as described above is repeated.

Figure 11:
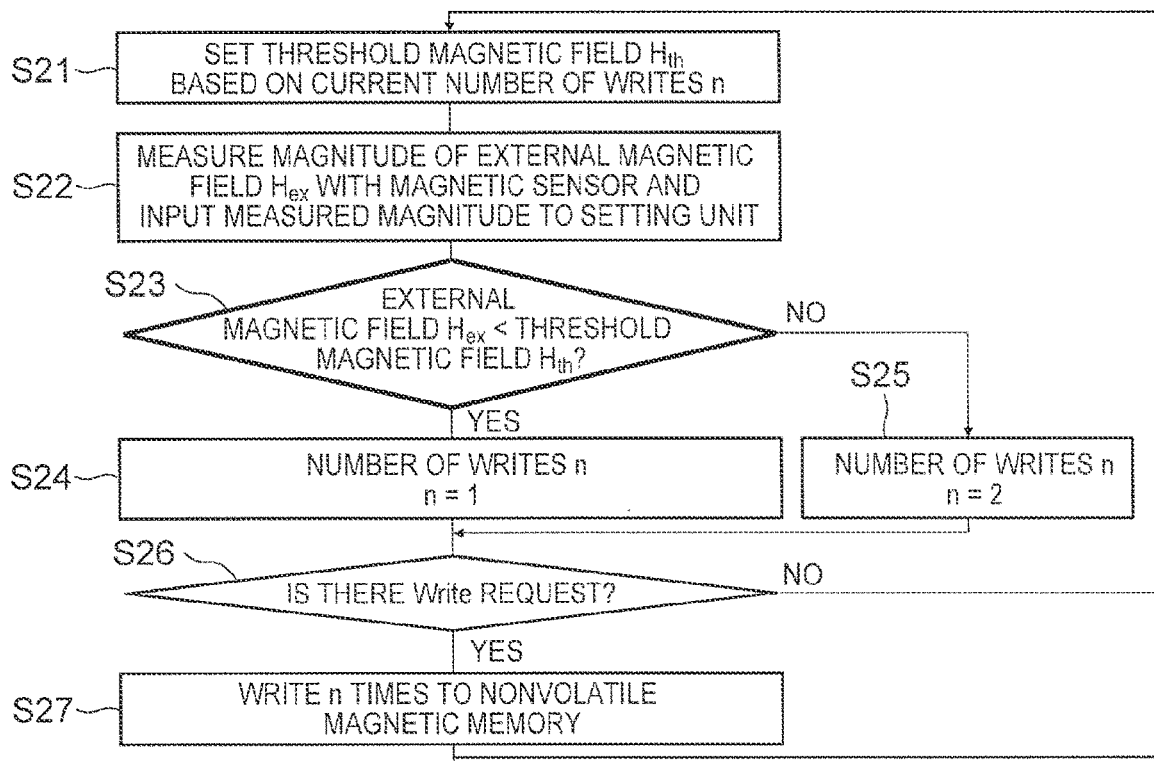
FIG. 11 is a diagram illustrating a control method of writing data in a magnetic storage device according to a second embodiment.
Figure 12:
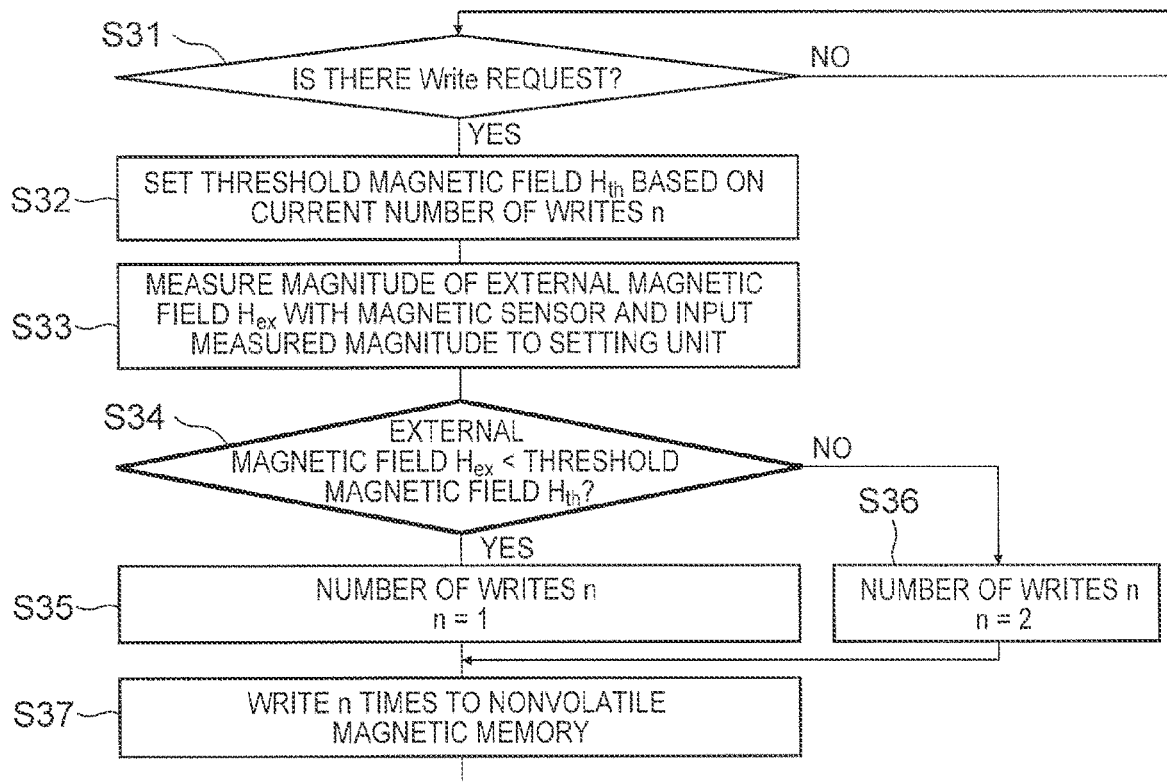
FIG. 12 is a diagram illustrating a control method of writing data in a magnetic storage device according to a second embodiment.

As shown in FIG. 12, step S26 of FIG. 11 may be executed before step S21. In the case of FIG. 11, it is possible for a memory controller 2a to write data to the nonvolatile magnetic memory 3 immediately after receiving a write command from the host 5. In the case of FIG. 12, since the magnitude of the external magnetic field Hex is measured after receiving the write command from the host 5, power consumption can be reduced.

Figure 13:
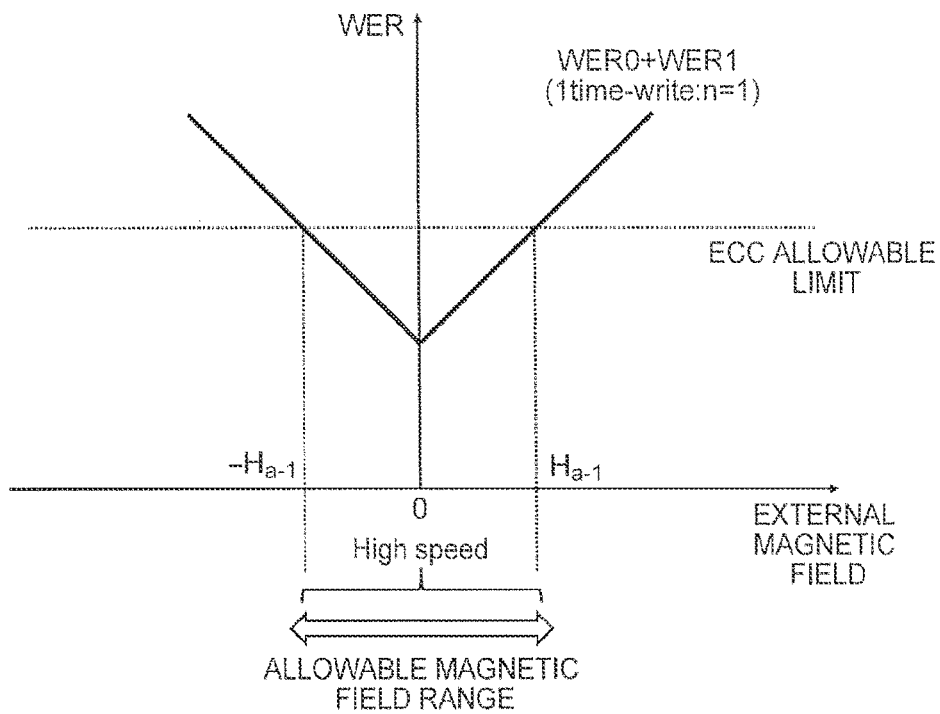
FIG. 13 depicts a relationship between a WER and a magnitude of an external magnetic field for a magnetic storage device according to a comparative example.

FIG. 13 is an example of a graph showing a relationship between the WER and the magnitude of external magnetic field Hex at the time of single (one-time) writing in the magnetic storage device according to the comparative example. In the magnetic storage device according to the comparative example, as shown in FIG. 13, a single writing is performed to the memory cell MC in response to the request for writing. Therefore, the WER will increase as the external magnetic field Hex applied to the magnetic storage device increases. As a result, the ECC allowable limit will eventually be exceeded and data initially written by the ECC cannot be restored normally.

On the other hand, the magnetic storage device 1a according to the second embodiment can perform the writing to the memory cell MC a plurality of times determined according to the magnitude of the external magnetic field Hex. In the example shown in FIG. 10, when the magnitude of the external magnetic field Hex becomes equal to or greater than the threshold magnetic field Hth, the number of writes is switched from once to twice. As a result, the WER is reduced, and the allowable magnetic field Ha-n can be made larger than in the case only one-time (single) writing.

The magnetic storage device 1a according to this second embodiment includes the magnetic sensor 4 in addition to the memory controller 2a and the nonvolatile magnetic memory 3. By connecting the memory controller 2a and the magnetic sensor 4 to each other, it is possible to adjust the number of writes (n value) used for writing data to the nonvolatile magnetic memory 3 according to the magnitude of the external magnetic field Hex. As a result, the write error can be reduced by increasing the number of writes utilized for each writing command, and the reliability and the external magnetic field tolerance of the magnetic storage device 1a can be improved. Further, the magnetic storage device 1a has less need for a magnetic shield, which contributes to product downsizing.

(3) Modification of Second Embodiment

A magnetic storage device 1b according to a modification of the second embodiment will be described with reference to FIGS. 14 to 17.

(3)-(a) Configuration Example of Magnetic Storage Device

Figure 14:
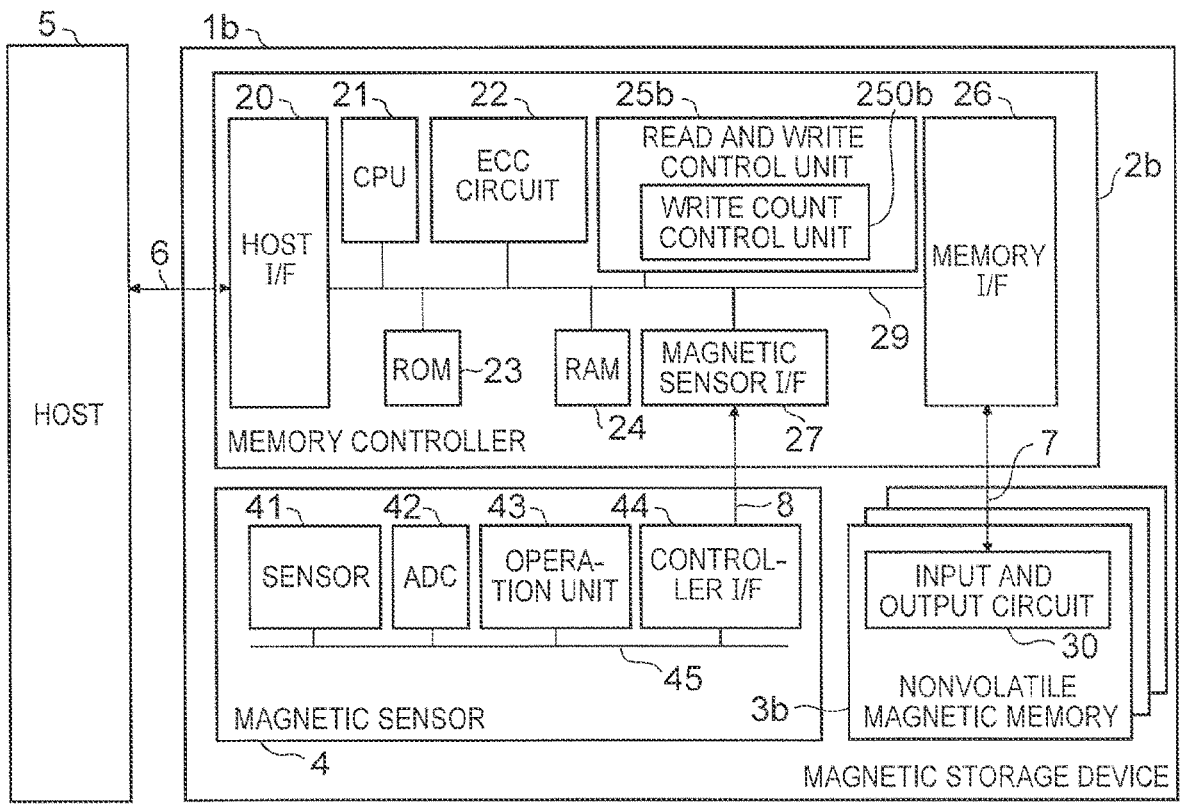
FIG. 14 is a block diagram of a magnetic storage device according to a modification of a second embodiment.
Figure 15:
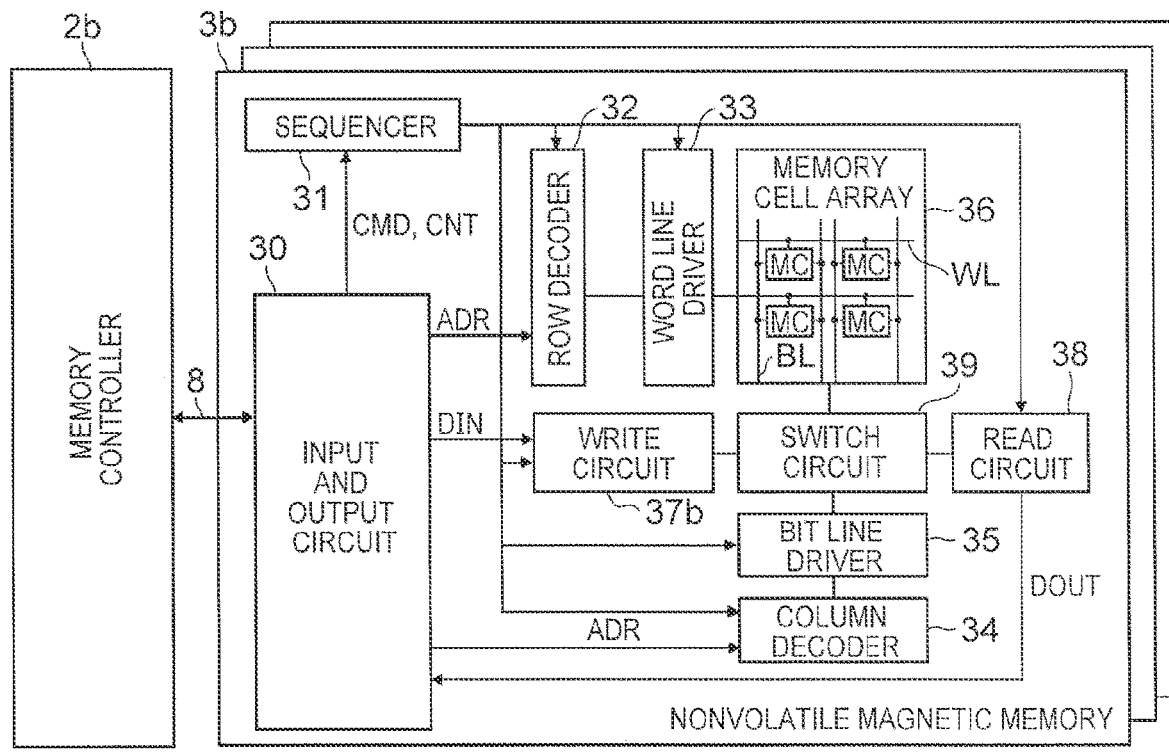
FIG. 15 is a block diagram of a nonvolatile magnetic memory according to the modification of a second embodiment.

FIG. 14 is a block diagram of the magnetic storage device 1b. FIG. 15 is a block diagram of a nonvolatile magnetic memory 3b. The magnetic storage device 1b according to the modification of the second embodiment has substantially the same configuration as the magnetic storage device 1a according to the second embodiment, but is different in that a memory controller 2b includes a mode selection unit 256 and the nonvolatile magnetic memory 3b includes a write pulse width control unit 372 and a write current control unit 374. In this modification, the write pulse width or the magnitude of the write current can be controlled according to the magnitude of the external magnetic field Hex instead of controlling the number of writes (n value) used for writing data to the nonvolatile magnetic memory 3b.

The scrub control unit 28 of the first embodiment is not an essential element of the magnetic storage device 1b according to the modification of the second embodiment and thus is not shown in FIG. 14. However, it is also possible to combine the first embodiment and this modification of the second embodiment. Therefore, the magnetic storage device 1b may also include the scrub control unit 28.

Figure 16:
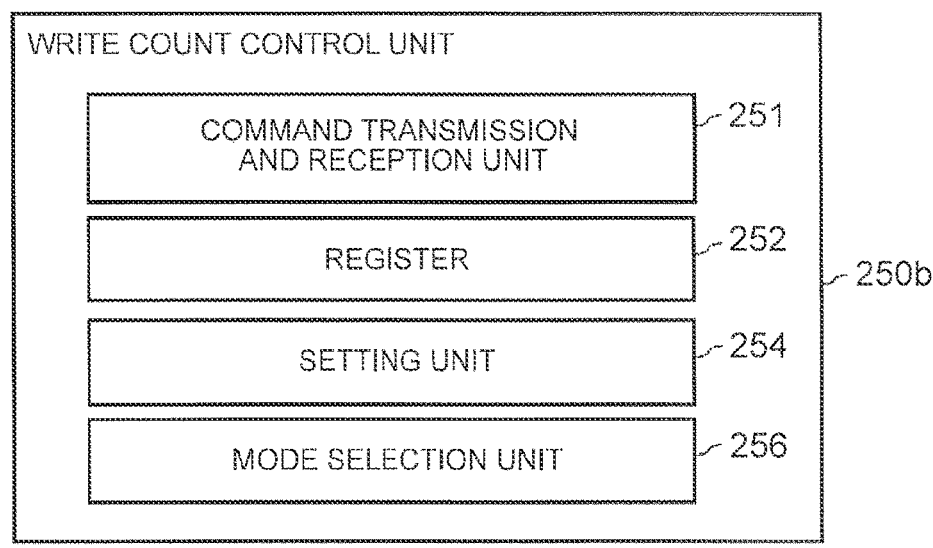
FIG. 16 is a block diagram of a write count control unit according to a modification of a second embodiment.

FIG. 16 is a block diagram of a write count control unit 250b. As shown in FIGS. 14 and 16, the memory controller 2b further includes the mode selection unit 256. The mode selection unit 256 selects parameters to be controlled according to the measured magnitude of the external magnetic field Hex. The parameters are, for example, the number of writes n to the nonvolatile magnetic memory 3b, the write pulse width, or the magnitude of the write current used in each writing. The mode selection unit 256 transmits a signal for controlling the operation to the write pulse width control unit 372, or the write current control unit 374, according to the selected parameter. A plurality of parameters including the number of writes (n value), the magnitude of the write pulse width, the magnitude of the write current, and the like may all be simultaneously controlled according to the magnitude of the external magnetic field Hex. For example, the mode selection unit 256 may control both the write pulse width control unit 372 and the write current control unit 374 to operate simultaneously.

Figure 17:
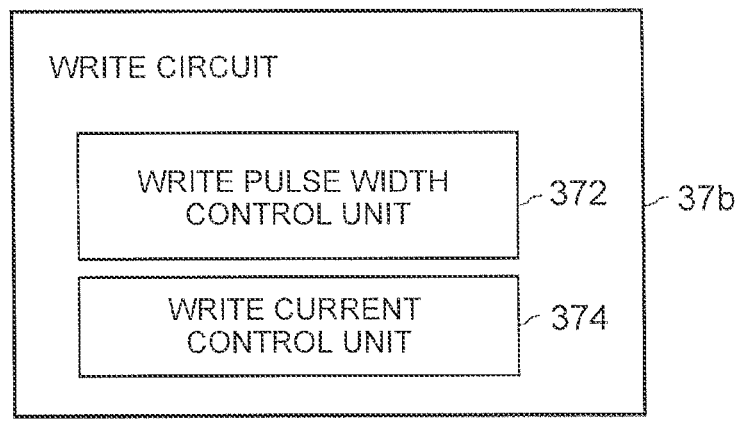
FIG. 17 is a block diagram of a write circuit according to a modification of a second embodiment.

FIG. 17 is a block diagram of a write circuit 37b. As shown in FIGS. 15 and 17, the write circuit 37b further includes the write pulse width control unit 372 and the write current control unit 374. The write pulse width control unit 372 controls the size of the write pulse width according to the magnitude of the external magnetic field Hex. The write current control unit 374 controls the magnitude of the write current according to the measured magnitude of the external magnetic field Hex.

The magnetic storage device 1b according to the modification of the second embodiment includes the magnetic sensor 4 in addition to the memory controller 2b and the nonvolatile magnetic memory 3b, similarly to the magnetic storage device 1a according to the second embodiment. By connecting the memory controller 2b and the magnetic sensor 4 to each other, it is possible to control the number of writes (n value) utilized for the nonvolatile magnetic memory 3b according to the magnitude of the external magnetic field Hex. As a result, the write error can be reduced, and the reliability and the tolerance of the magnetic storage device 1b to external magnetic fields can be improved. The magnetic storage device 1b has less need for a magnetic shield, which contributes to product downsizing.

In the magnetic storage device 1b according to the modification of the second embodiment, it is possible to control the write pulse width and/or the magnitude of the write current, instead of controlling the number of writes (n values) to the nonvolatile magnetic memory 3b. Therefore, the time required to repeat the write command n times can be avoided.

(3) Other Modifications

Certain other modifications will be described with reference to FIGS. 18 to 21. In the following description, chips C1 to C8 (individually referred to as a first chip C1, second chip C2 . . . an eighth chip C8) are used as an example of chips C, but, in general, the type and number of each chip C in the possible modifications are not limited thereto.

Figure 18:
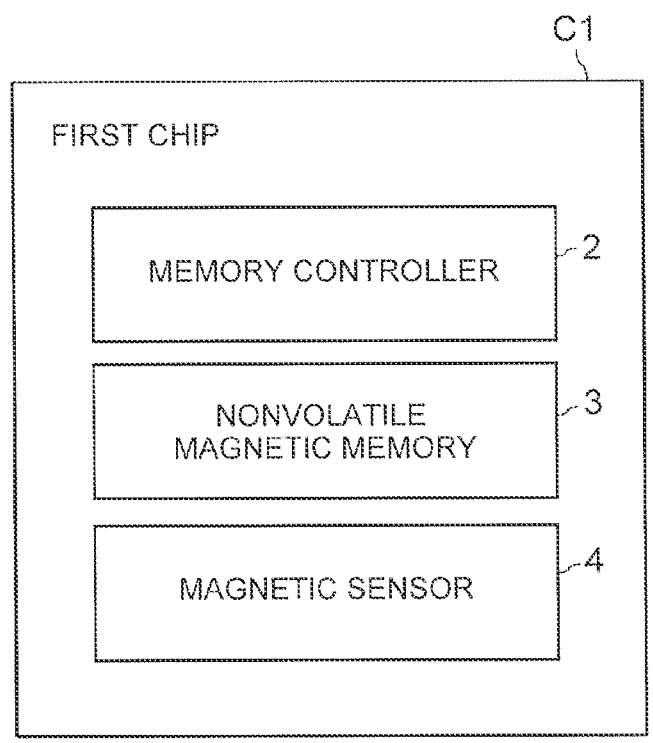
FIG. 18 is a block diagram of a magnetic storage device according to another modification in which a memory controller, a nonvolatile magnetic memory, and a magnetic sensor are mounted on a first chip.

FIG. 18 is a block diagram showing a configuration example in which the memory controller 2 (corresponding to memory controller 2a or 2b), the nonvolatile magnetic memory 3 (also corresponding to nonvolatile magnetic memory 3b), and the magnetic sensor 4 of the magnetic storage device 1 (corresponding to memory controller 1a or 1b) according to the above embodiment are mounted on a first chip C1. In the case depicted in FIG. 18, the magnetic storage device 1 is mounted on the same chip, which contributes to product downsizing.

Figure 19:
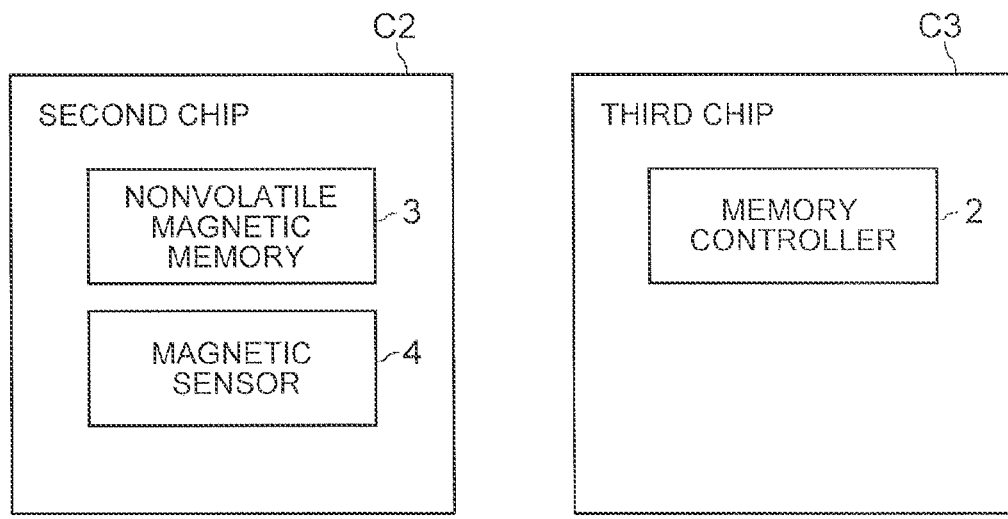
FIG. 19 is a block diagram of a magnetic storage device according to still another modification in which a nonvolatile magnetic memory and a magnetic sensor are mounted on a second chip and a memory controller is mounted on a third chip.

FIG. 19 is a block diagram showing a configuration example in which the nonvolatile magnetic memory 3 and the magnetic sensor 4 of the magnetic storage device 1 are mounted on a second chip C2 and the memory controller 2 is mounted on a third chip C3. In the case depicted in FIG. 19, since the nonvolatile magnetic memory 3 and the magnetic sensor 4 are mounted on the same chip, the magnetic sensor 4 can measure the magnetic field being applied to the nonvolatile magnetic memory 3 with high accuracy.

Figure 20:
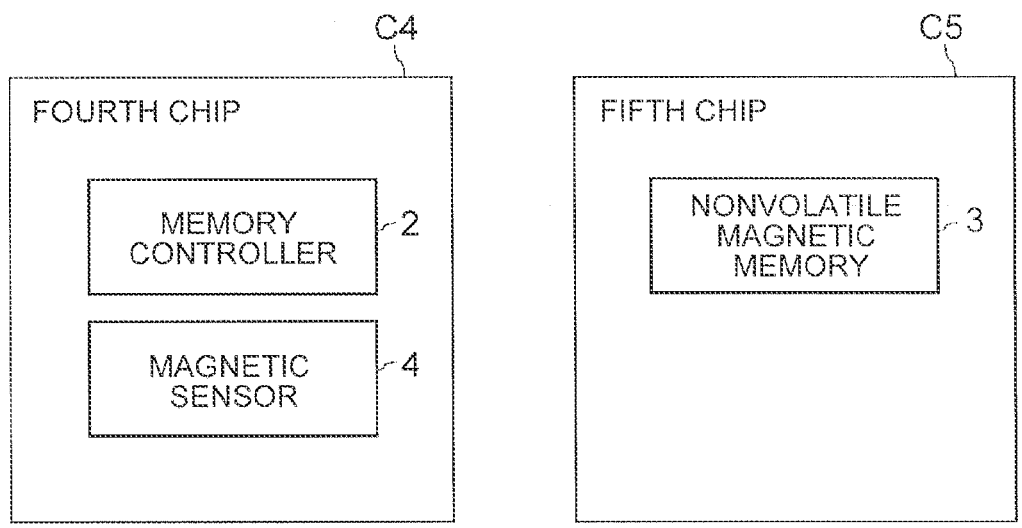
FIG. 20 is a block diagram of a magnetic storage device according to yet another modification in which a memory controller and a magnetic sensor are mounted on a fourth chip and a nonvolatile magnetic memory is mounted on a fifth chip.

FIG. 20 is a block diagram showing a configuration example in which the memory controller 2 and the magnetic sensor 4 of the magnetic storage device 1 are mounted on a fourth chip C4 and the nonvolatile magnetic memory 3 is mounted on a fifth chip C5. In the case depicted in FIG. 20, the packaging cost for the magnetic sensor chip can be reduced by forming the magnetic sensor as an embedded MRAM (eMRAM). Furthermore, since the nonvolatile magnetic memory 3 is an independent chip, the nonvolatile magnetic memory 3 can be formed in a process dedicated to the fabrication of MRAM such that temperatures in fabrication can be controlled according to the limitations of MRAM devices.

Figure 21:
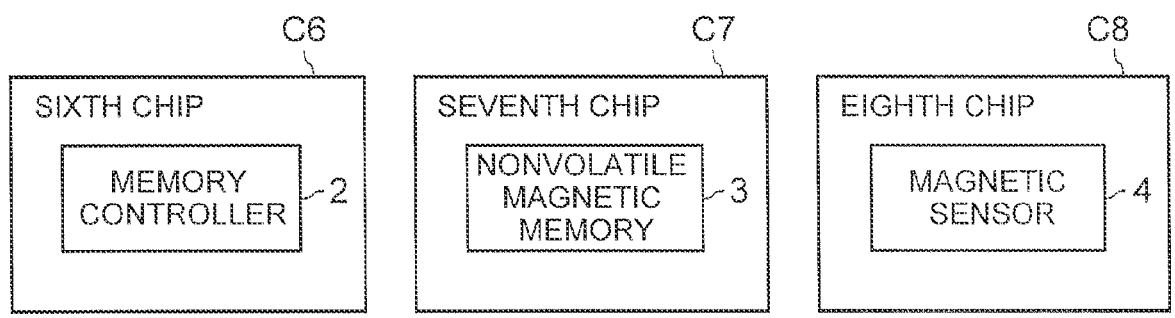
FIG. 21 is a block diagram of a magnetic storage device according to another modification in which a memory controller, a nonvolatile magnetic memory, and a magnetic sensor are mounted on different chips.

FIG. 21 is a block diagram showing a configuration example in which the memory controller 2, the nonvolatile magnetic memory 3, and the magnetic sensor 4 of the magnetic storage device 1 are mounted on different chips.

As shown in FIG. 21, each unit may be mounted on a different chip. That is, the memory controller 2 may be mounted on a sixth chip C6, the nonvolatile magnetic memory 3 may be mounted on a seventh chip C7, and the magnetic sensor 4 may be mounted on an eighth chip C8. In the case depicted in FIG. 21, the nonvolatile magnetic memory 3 can be fabricated at temperatures suitable to MRAM since the nonvolatile magnetic memory 3 is an independent chip.

The chips C may be electrically connected and stacked with each other via Through-Silicon-Vias (TSVs) or bumps. In order to accurately measure the magnitude of the magnetic field applied to the nonvolatile magnetic memory 3, the nonvolatile magnetic memory 3 and the magnetic sensor 4 are preferably closely adjacent to each other. Furthermore, as long as the memory controller 2 and the magnetic sensor 4 are electrically connected in some manner, it is not required for these elements to be directly connected to each other.

The memory controller 2, the nonvolatile magnetic memory 3, and the magnetic sensor 4 may be mounted on a dual inline memory module (DIMM) interface or a peripheral component interconnect express (PCI Express®) (PCIe) interface. In particular, it is possible to mount the memory controller 2, the nonvolatile magnetic memory 3, and the magnetic sensor 4 on a substrate for mobile devices, Internet of Things (IoT) devices, or incorporation on a vehicle.

It is also possible to combine the magnetic storage devices 1 (e.g., magnetic storage devices 1a and 1b) with a magnetic shield or shielding. In such a case, reliability and external magnetic field tolerance of the magnetic storage device 1 can be further improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic storage device, comprising:
   a nonvolatile magnetic memory including a plurality of memory cells each equipped with a magnetoresistance effect element;
   a magnetic sensor configured to measure a magnitude of an external magnetic field; and
   a controller configured to cause data to be written to the plurality of memory cells in a writing operation with writing parameters set according to the measured magnitude of the external magnetic field, wherein
   the controller:
      determines a threshold value based on a current number of times for writing data to the memory cells within the same writing operation; and
      upon receipt of the measured magnitude of the external magnetic field that is greater than or equal to the determined threshold value, increases the number of times for writing data to the memory cells within the same writing operation.

2. The magnetic storage device according to claim 1, wherein the magnetic sensor is a Hall effect sensor.

3. The magnetic storage device according to claim 1, wherein the magnetic sensor is a magnetic tunnel junction (MTJ) element.

4. The magnetic storage device according to claim 1, wherein the nonvolatile magnetic memory, the magnetic sensor, and the controller are on one substrate.

5. The magnetic storage device according to claim 1, wherein the nonvolatile magnetic memory and the magnetic sensor are on one substrate.

6. The magnetic storage device according to claim 1, wherein
   the magnetic sensor is a magnetic tunnel junction (MTJ) element, and
   the magnetic sensor and the nonvolatile magnetic memory are on one dual inline memory module (DIMM).

7. The magnetic storage device according to claim 1, wherein the controller sets a write pulse width for writing data to the plurality of memory cells according to the measured magnitude of the external magnetic field.

8. The magnetic storage device according to claim 1, wherein the controller sets a write current for writing data to the plurality of memory cells according to the measured magnitude of the external magnetic field.

9. The magnetic storage device according to claim 1, further comprising:
   a magnetic shield covering the nonvolatile magnetic memory.

10. The magnetic storage device according to claim 1, wherein the controller determines the threshold value using a predetermined magnitude of the external magnetic field corresponding to the current number of times for writing data to the memory cells within the same writing operation.

11. The magnetic storage device according to claim 10, wherein upon receipt of the measured magnitude of the external magnetic field that is less than the determined threshold value, the controller determines to maintain the current number of times for writing data to the memory cells within the same writing operation.

12. The magnetic storage device according to claim 10, wherein the controller determines the threshold value to be lower than the predetermined magnitude of the external magnetic field.

13. A magnetic storage device, comprising:
a nonvolatile magnetic memory including a plurality of memory cells each equipped with a magnetoresistance effect element;
a magnetic sensor configured to measure a magnitude of an external magnetic field; and
a controller configured to:
determine a threshold value based on a current write pulse width setting to be used in a writing operation for writing data to the plurality of memory cells;
upon receipt of the measured magnitude of the external magnetic field that is greater than or equal to the determined threshold value, change the write pulse width setting; and
in response to a command from an external host device, perform the writing operation to write data provided with the command to the plurality of memory cells with the changed write pulse width setting.

14. The magnetic storage device according to claim 13, wherein the magnetic sensor is a Hall effect sensor.

15. The magnetic storage device according to claim 13, wherein the magnetic sensor is a magnetic tunnel junction (MTJ) element.

16. The magnetic storage device according to claim 15, wherein the write pulse width is a non-zero value.

17. The magnetic storage device according to claim 13, wherein the nonvolatile magnetic memory, the magnetic sensor, and the controller are on one substrate.

18. The magnetic storage device according to claim 13, further comprising:
a magnetic shield covering the nonvolatile magnetic memory.

19. A magnetic storage device, comprising:
a plurality of memory cells each with a magnetoresistance effect element;
a writing circuit configured to write data to the plurality of memory cells according to commands from a host device;
a magnetic sensor configured to measure a magnitude of an external magnetic field; and
a controller configured to:
determine a threshold value based on a current writing parameter value for writing data in a writing operation to the plurality of memory cells; and
upon receipt of the measured magnitude of the external magnetic field that is greater than or equal to the determined threshold value, control the writing circuit to adjust the writing parameter value, and then cause the writing circuit to perform the write operation with the adjusted writing parameter value.

20. The magnetic storage device according to claim 19, wherein the writing parameter is a number of times for repeated writing of the same data to the same memory cells within the same write operation.

21. The magnetic storage device according to claim 20, wherein the magnetic sensor is on a chip with the plurality of memory cells.

22. The magnetic storage device according to claim 19, wherein the writing parameter is a write pulse width or a write current magnitude.

23. The magnetic storage device according to claim 19, wherein the controller is configured to adjust a plurality of writing parameters for writing data to the plurality of memory cells, and at least one of the writing parameters is a number of times for repeated writing of the same data to the same memory cells within the same write operation, a write pulse width, or a write current magnitude.

* * * * *